United States Patent
Shibuya et al.

[11] Patent Number: 5,923,961
[45] Date of Patent: Jul. 13, 1999

[54] METHOD OF MAKING AN ACTIVE MATRIX TYPE DISPLAY

[75] Inventors: Tsukasa Shibuya; Atsushi Yoshinouchi, both of Nara; Hongyong Zhang; Akira Takenouchi, both of Kanagawa, all of Japan

[73] Assignees: Semiconductor Energy Laboratory Co., Ltd., Kanagawa-ken; Sharp Kabushiki Kaisha, Osaka, both of Japan

[21] Appl. No.: 08/968,025

[22] Filed: Nov. 12, 1997

[30] Foreign Application Priority Data

Nov. 12, 1996 [JP] Japan .................................. 8-315486

[51] Int. Cl.⁶ .................................................. H01L 21/339
[52] U.S. Cl. ............................ 438/149; 438/306; 438/307
[58] Field of Search .................................. 438/149, 306, 438/307

[56] References Cited

U.S. PATENT DOCUMENTS

| | | |
|---|---|---|
| 4,536,943 | 8/1985 | Kakumu . |
| 5,208,476 | 5/1993 | Inoue . |
| 5,292,675 | 3/1994 | Codama . |
| 5,612,234 | 3/1997 | Ha . |
| 5,650,636 | 7/1997 | Takemura et al. . |
| 5,757,048 | 5/1998 | Inoue . |
| 5,767,530 | 6/1998 | Ha . |
| 5,789,762 | 8/1998 | Koyama et al. . |
| 5,843,833 | 12/1998 | Ohtani et al. . |
| 5,856,689 | 1/1999 | Suzawa . |

*Primary Examiner*—Charles Bowers
*Assistant Examiner*—Martin Sulsky
*Attorney, Agent, or Firm*—Fish & Richardson P.C.

[57] ABSTRACT

There is provided an active matrix type display in which thin film transistors having required characteristics are provided selectively in a pixel matrix portion and a peripheral driving circuit portion. In a structure having the pixel matrix portion and the peripheral driving circuit portion on the same substrate, N-channel type thin film transistors having source and drain regions formed through a non-self-alignment process and low concentrate impurity regions formed through a self-alignment process are formed in the pixel matrix portion and in an N-channel driver portion of the peripheral driving circuit portion. A P-channel type thin film transistor in which no low concentrate impurity region is formed and source and drain regions are formed only through the self-alignment process is formed in a P-channel driver portion of the peripheral driving circuit portion.

14 Claims, 13 Drawing Sheets

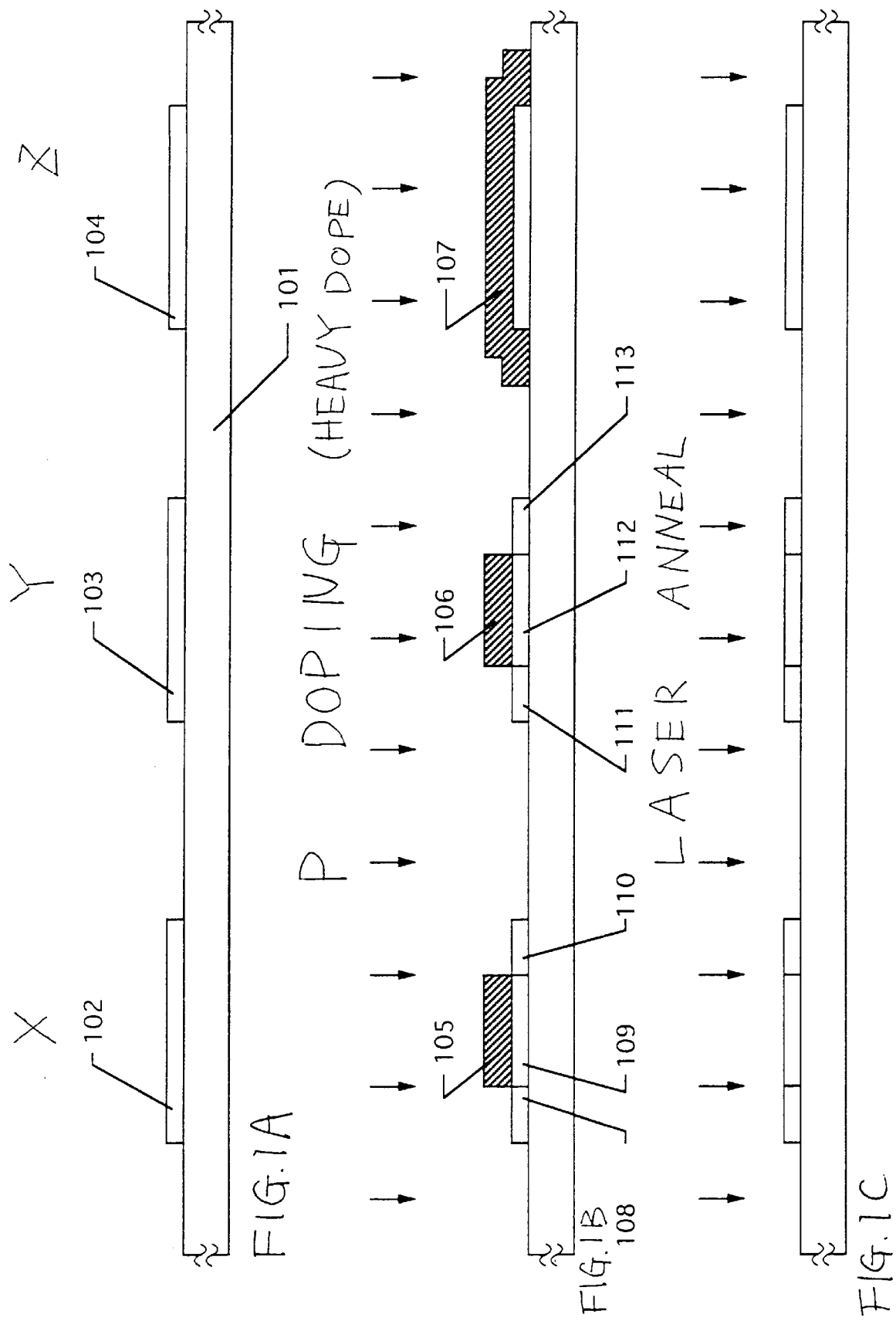

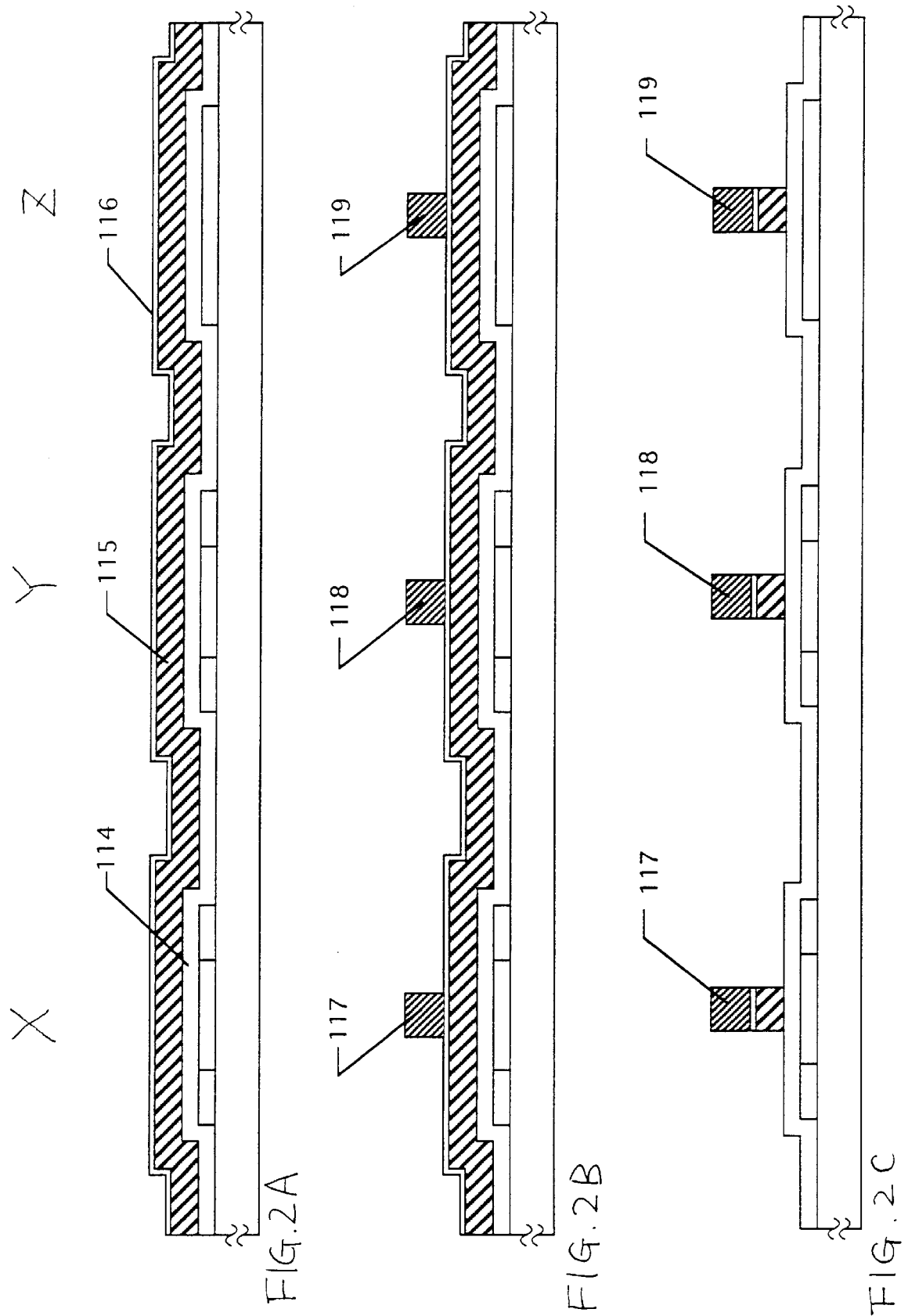

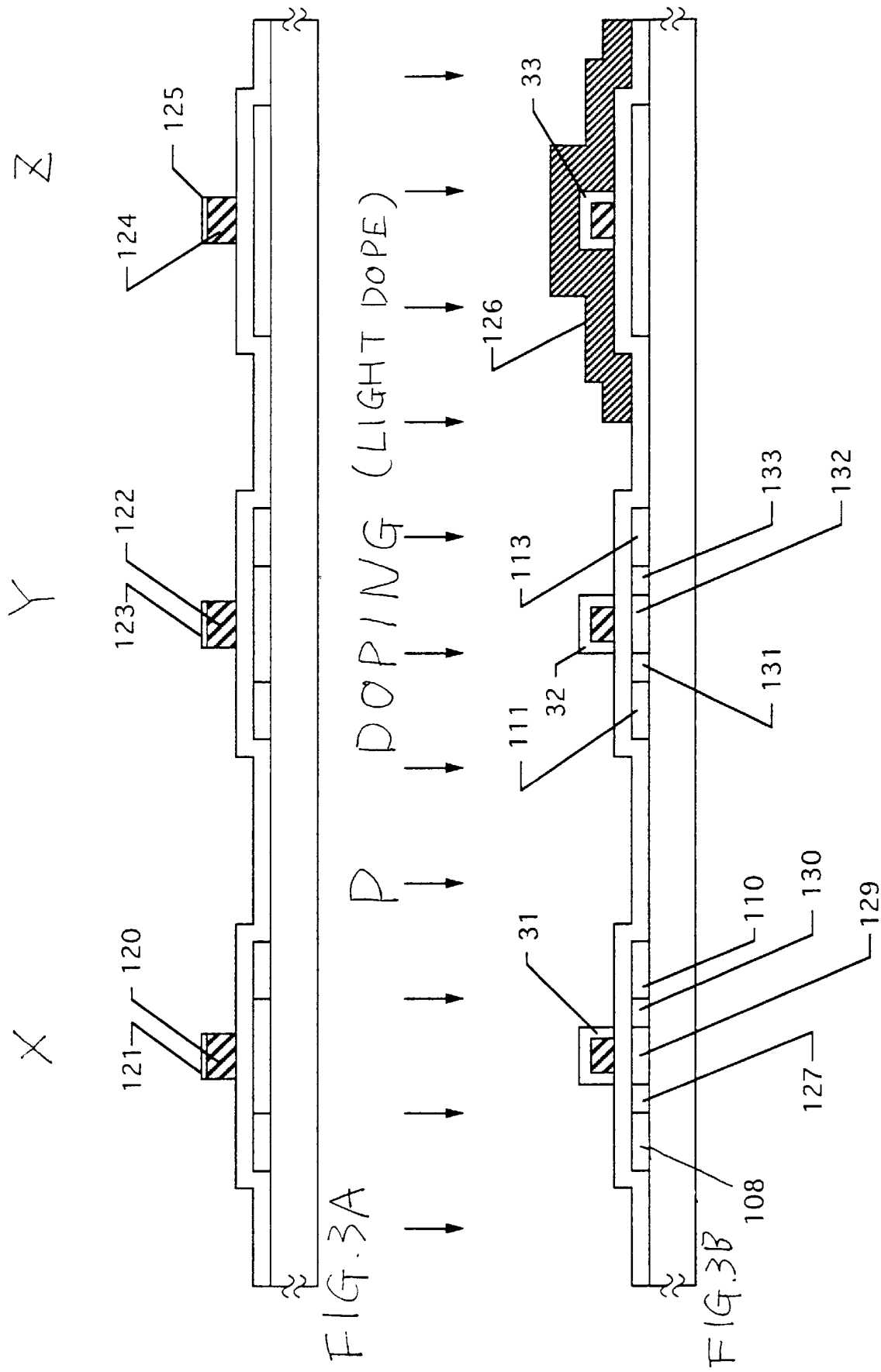

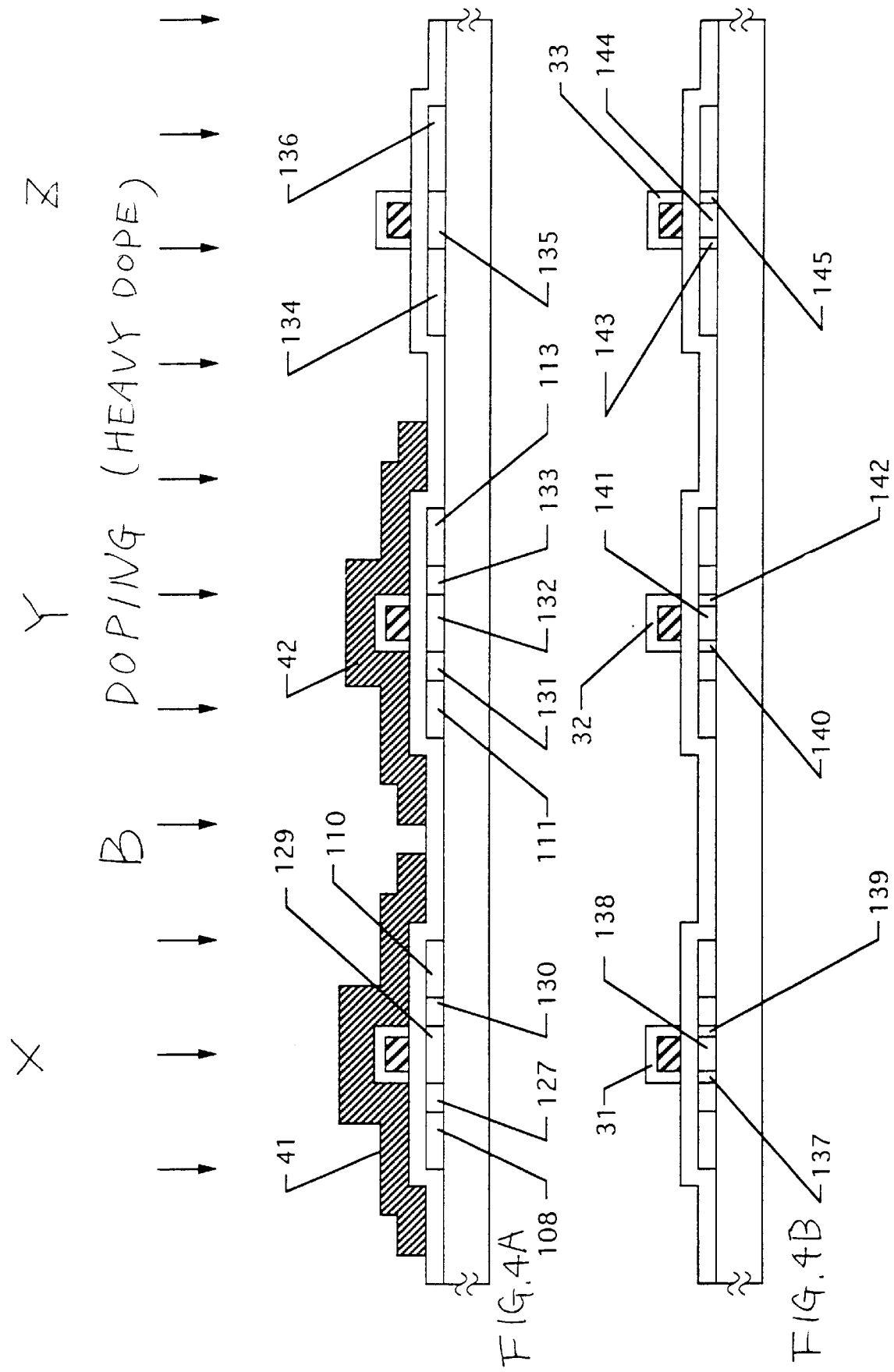

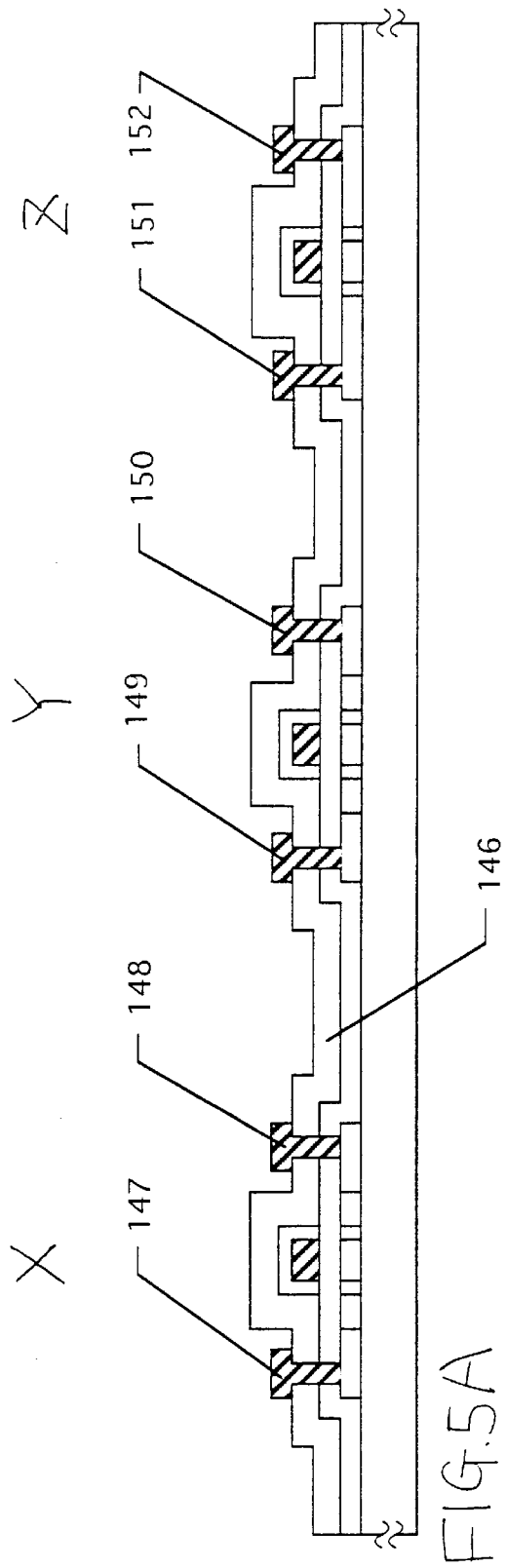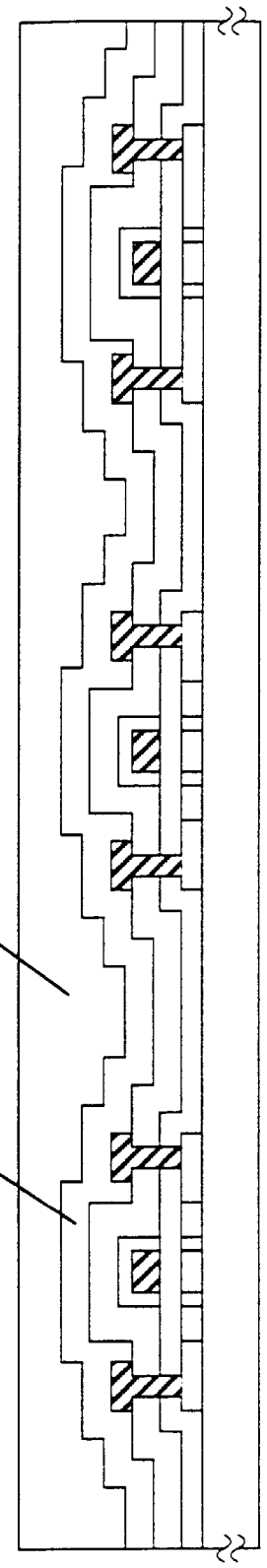
FIG.5A
FIG.5B

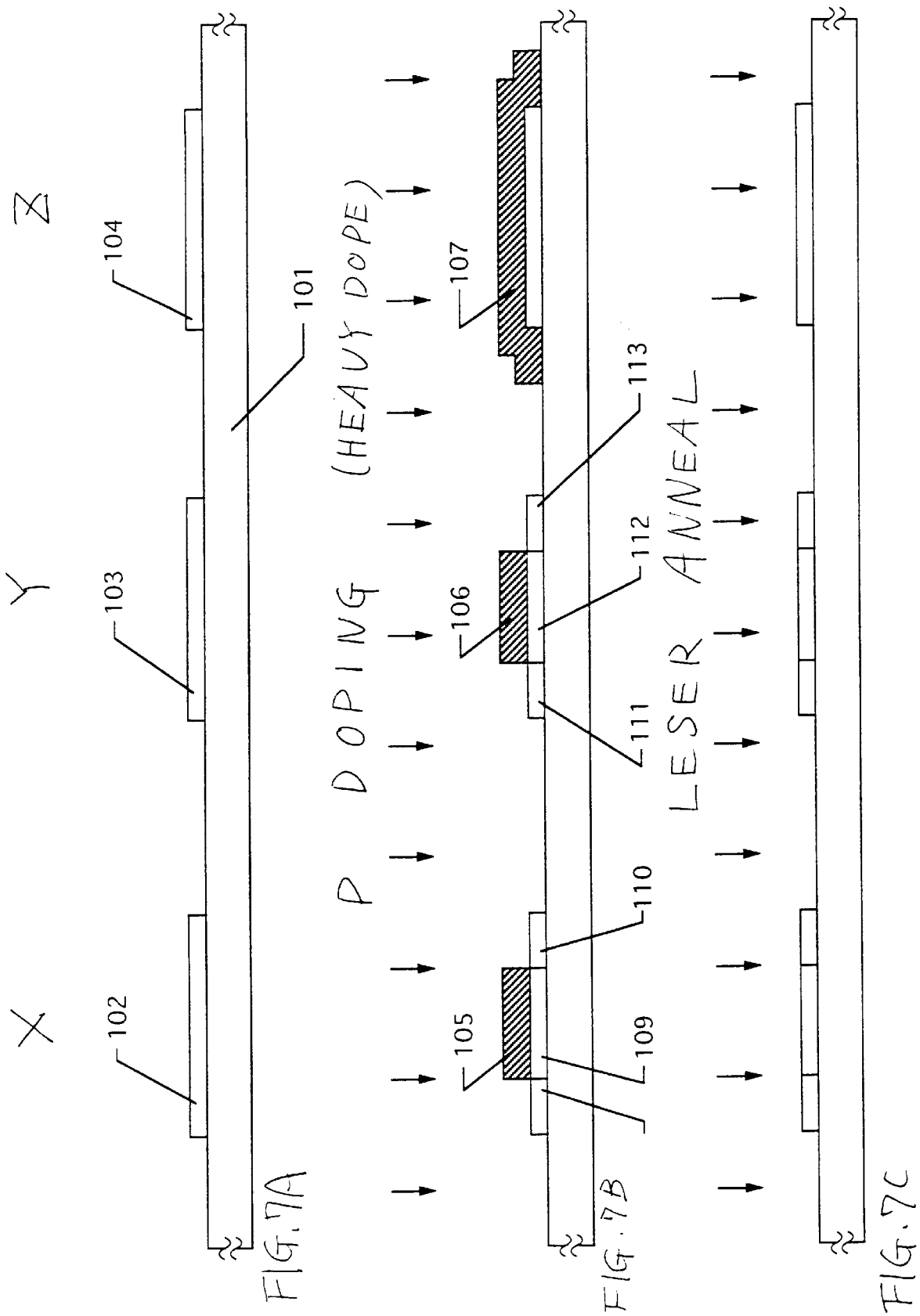

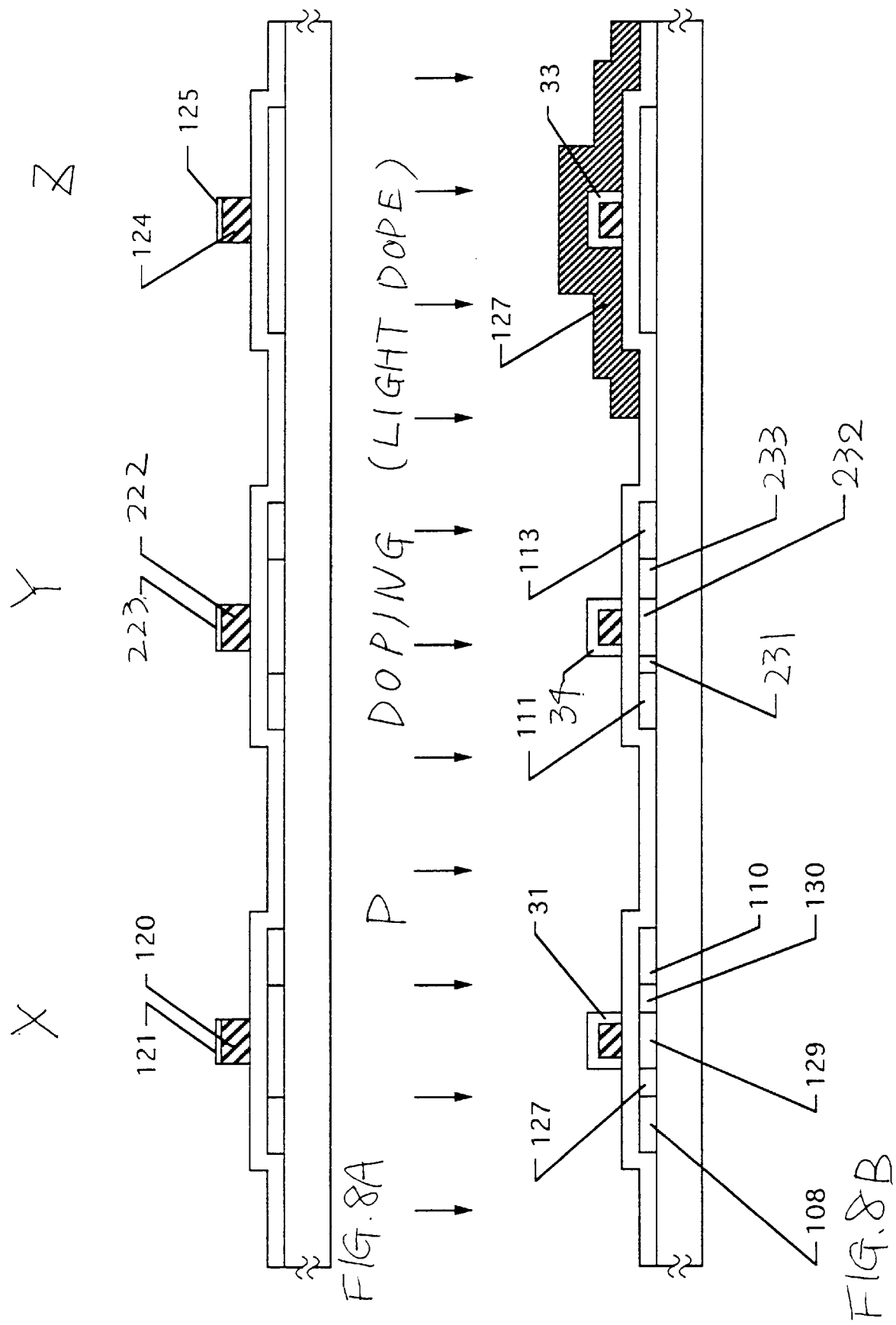

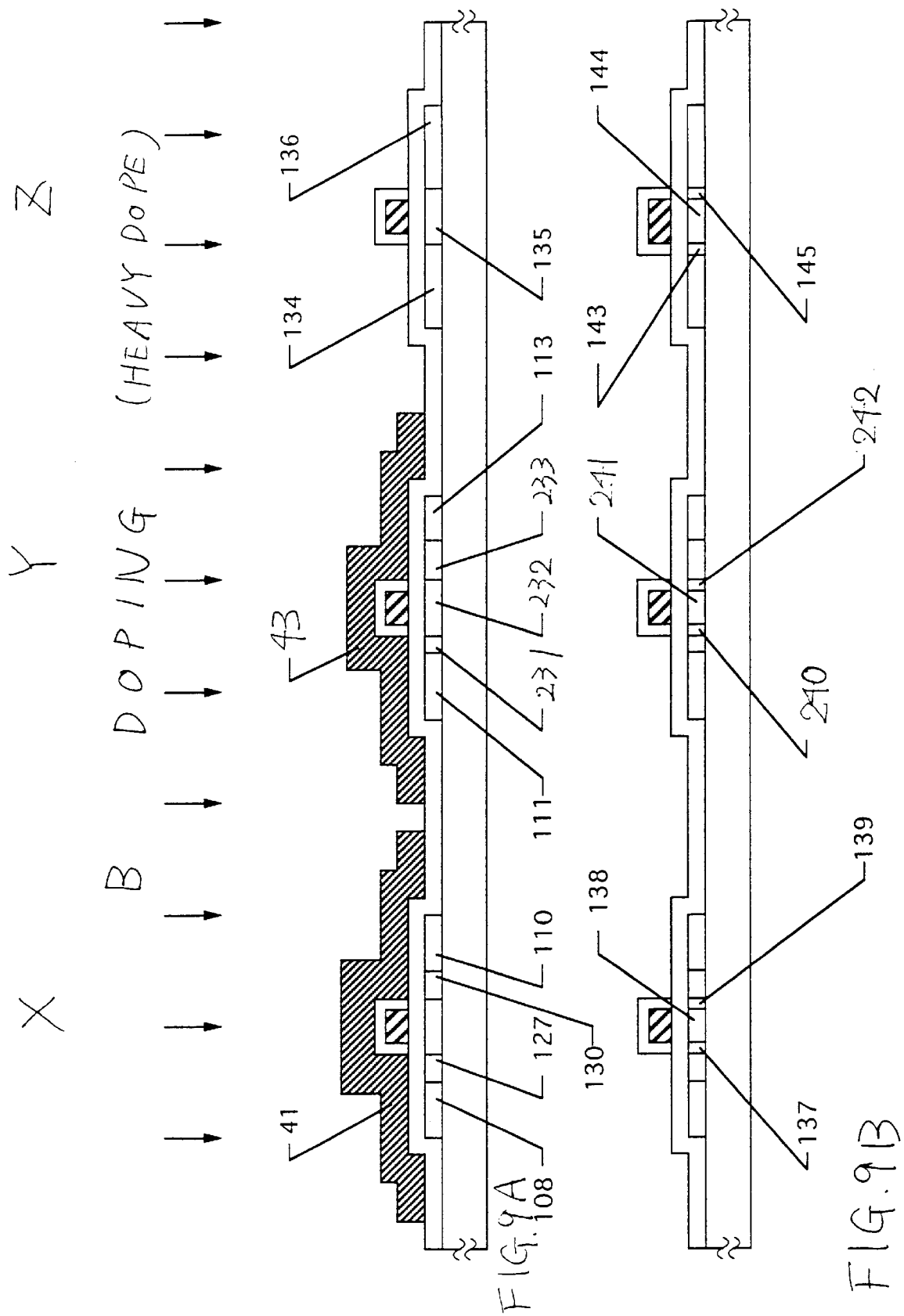

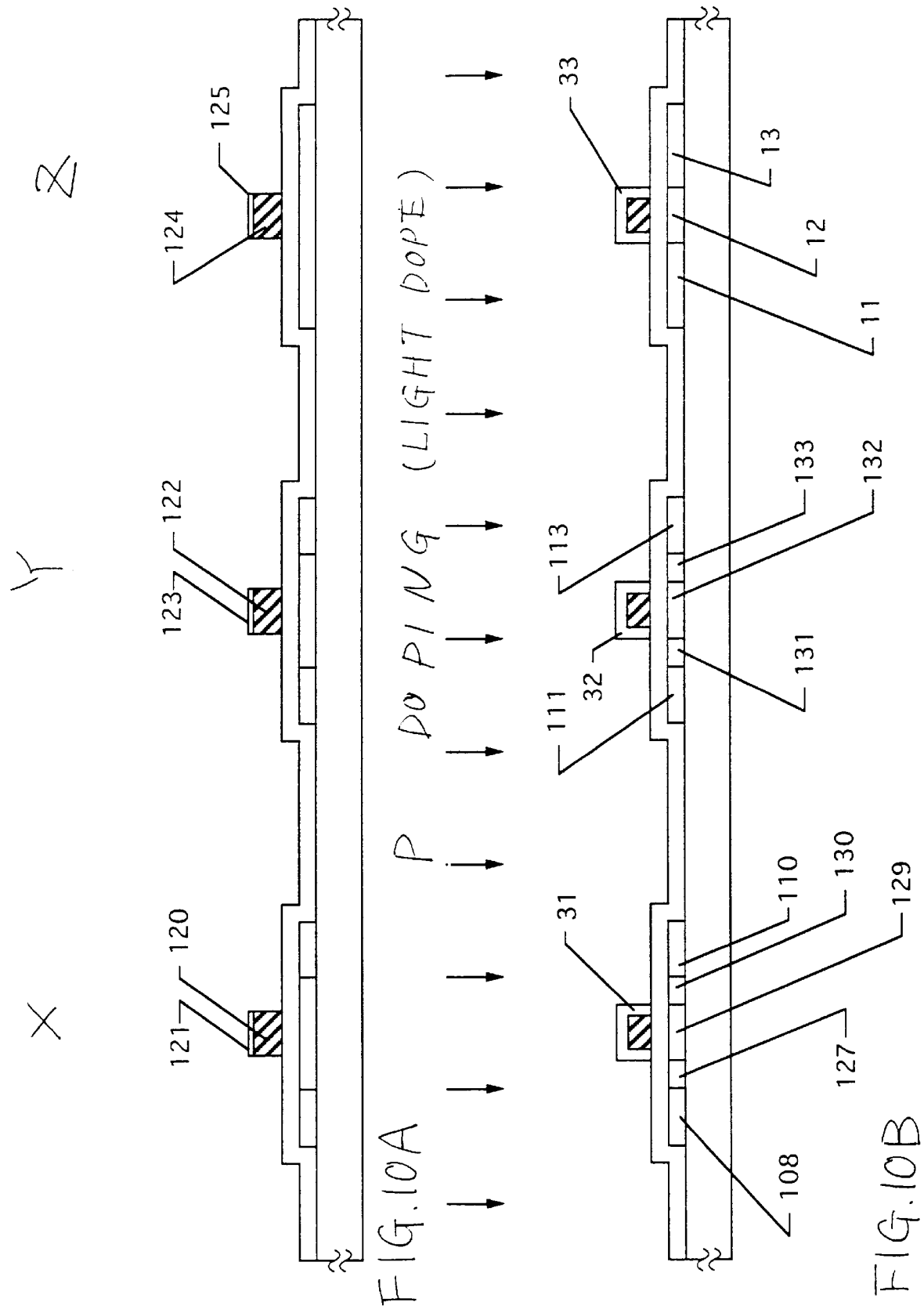

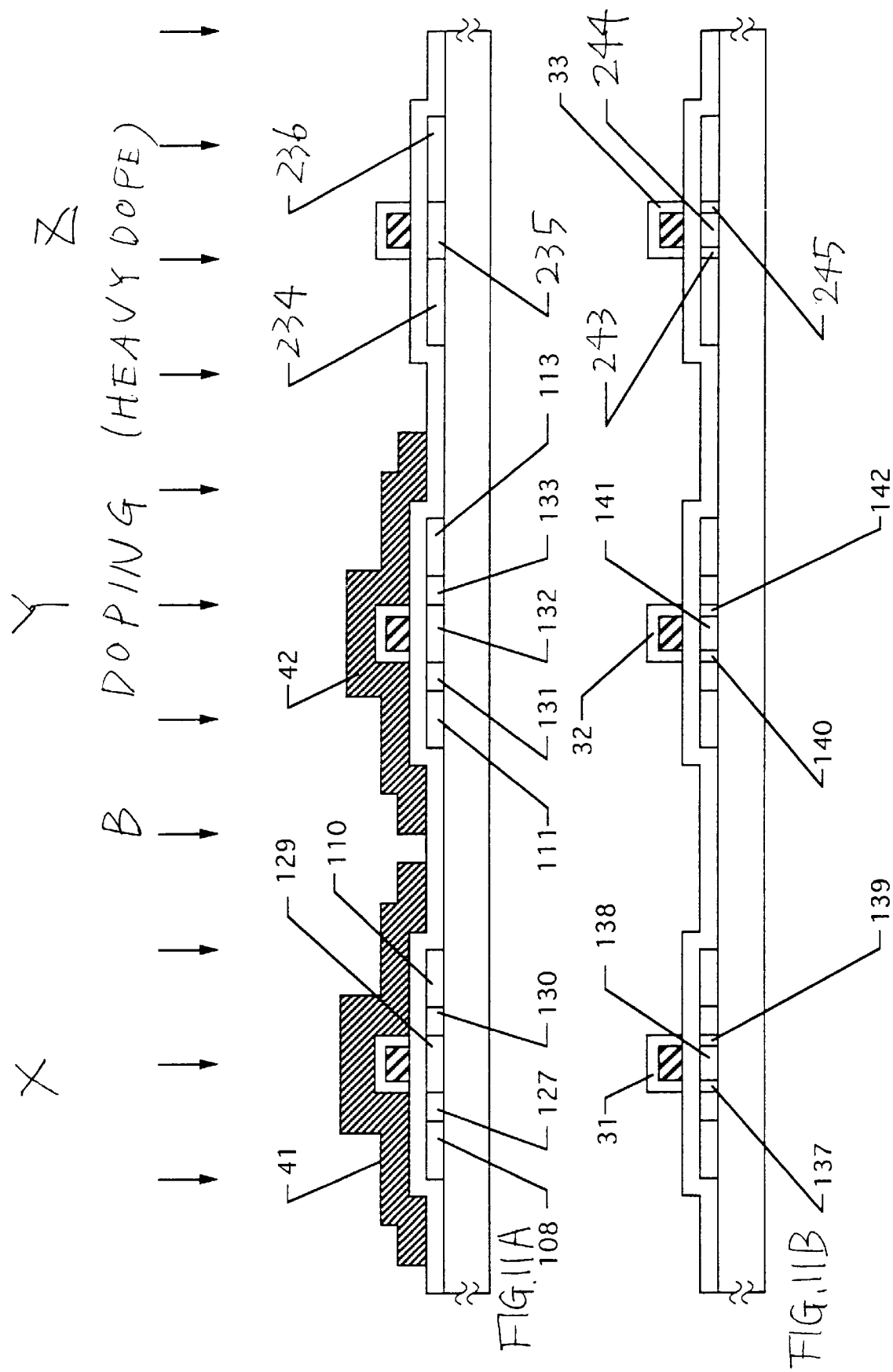

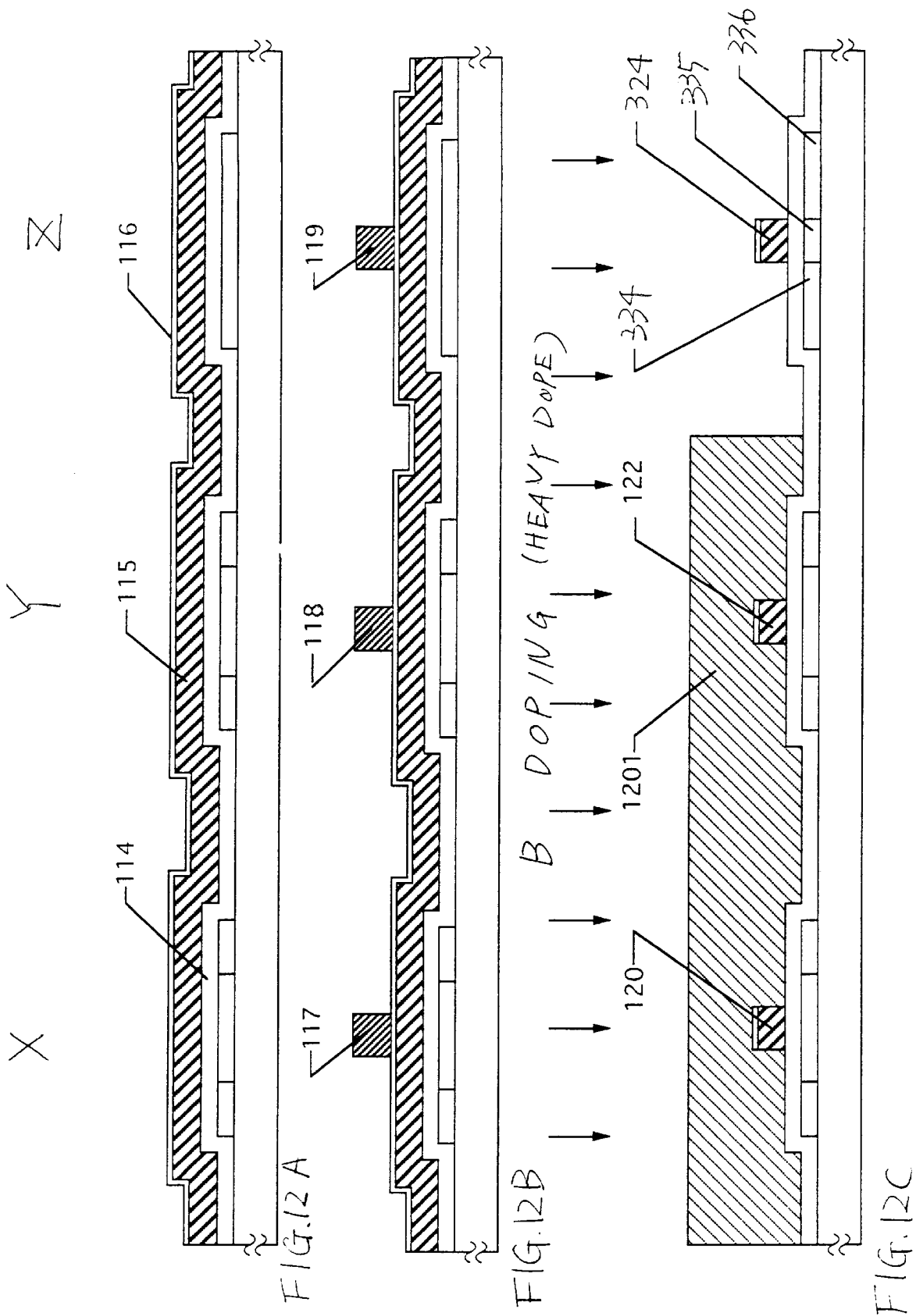

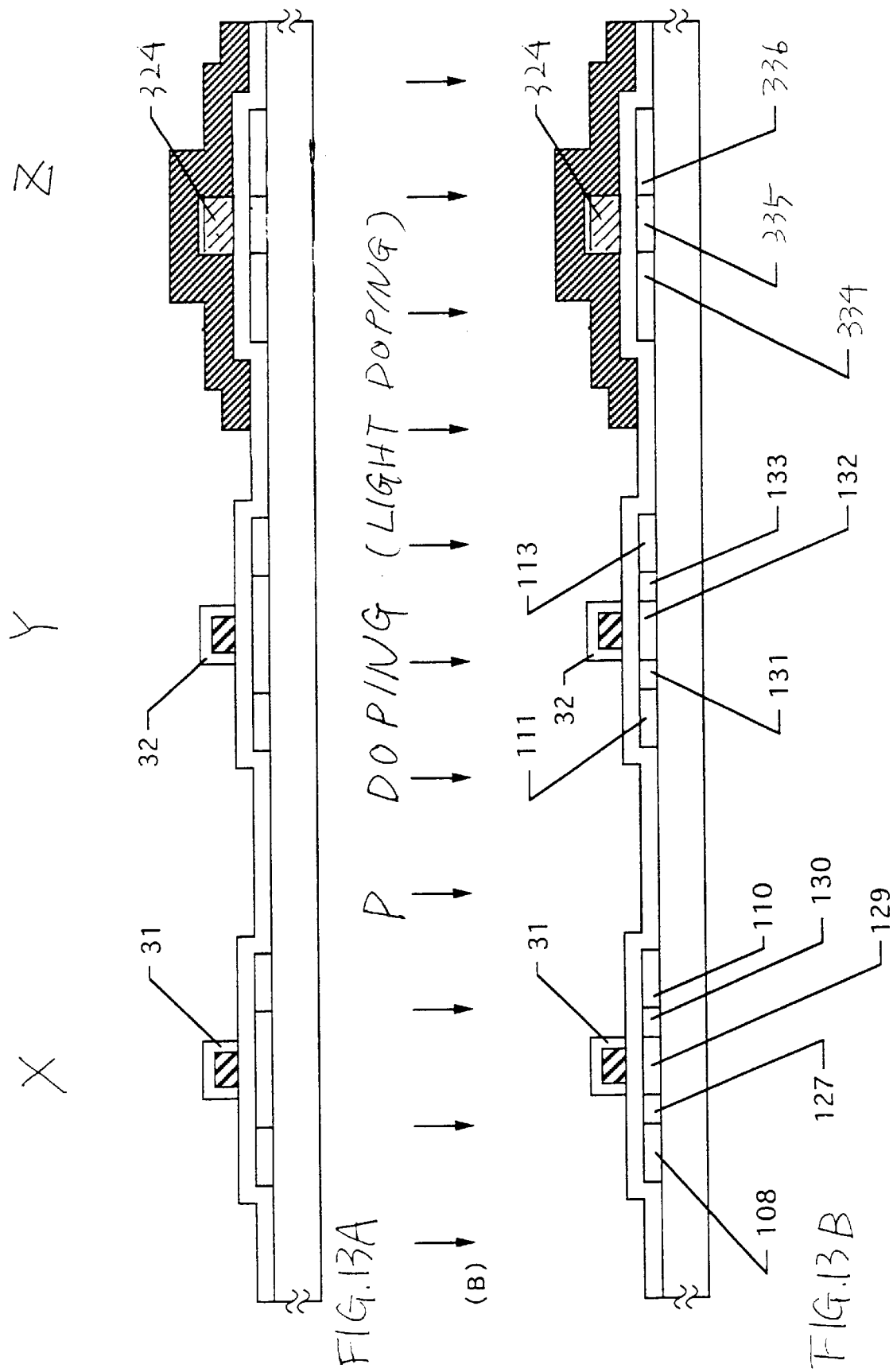

METHOD OF MAKING AN ACTIVE MATRIX TYPE DISPLAY

BACKGROUND OF THE INVENTION

1. Field of the Invention

The present invention relates to a structure of an active matrix type liquid crystal display and more particularly to a structure of an active matrix type liquid crystal display into which a peripheral driving circuit is integrated.

2. Description of Related Art

There has been known an active matrix type liquid crystal display having a structure in which a thin film transistor is provided individually in each of several hundreds x several hundreds pixel electrodes provided in a matrix. The thin film transistor provided in each pixel has a function of controlling electric charge input/output to/from each pixel electrode.

There has been also known one having a structure called a peripheral driving circuit integrated type in which a pixel matrix portion is integrated with a peripheral driving circuit on a same glass substrate. This peripheral driving circuit integrated structure is useful in that the production cost can be lowered and the whole structure can be miniaturized. Either P- or N-channel type thin film transistor is provided as a switching element in the pixel matrix circuit in general. Further, a circuit composed of P-channel and N-channel type thin film transistors is provided in the peripheral driving circuit.

SUMMARY OF THE INVENTION

In the peripheral driving circuit integrated liquid crystal display as described above, the thin film transistors provided in the pixel matrix circuit and the peripheral driving circuit are fabricated on the same substrate in the same time.

However, required transistor characteristics is different in the pixel matrix circuit and in the peripheral driving circuit in general.

For instance, although the thin film transistor provided in the pixel matrix circuit is not required to operate at such high speed, it is required to have a low OFF current characteristic strictly because it is required to have a charge retaining function in the pixel electrode.

Meanwhile, the thin film transistor provided in the peripheral driving circuit is required to have characteristics of operating at high speed and of flowing a large current preferentially. A thin film transistor composing a buffer circuit in particular is required to have the characteristics of operating at high speed and of flowing a large current.

Further, the thin film transistor provided in the peripheral driving circuit is required that its characteristics deteriorate less because it is required to operate at high speed. That is, because the higher the speed of the operation, the more the influence of the deterioration is actualized, one which is influenced least by that is required.

Further, the mobility of the N-channel type thin film transistor is higher than that of the P-channel type thin film transistor by two to three times in general. It poses a problem in terms of the operational balance when a CMOS structure is adopted. It poses a problem in the peripheral driving circuit in particular in which the CMOS structure is adopted.

Then, it has been necessary to correct the difference of the mobility of the N-channel type thin film transistor and the P-channel type thin film transistor.

Accordingly, it is an object of the present invention disclosed in the present specification to provide a peripheral driving circuit integrated active matrix type liquid crystal display which satisfies the above-mentioned various requirements.

One of the inventions disclosed in the present specification is characterized in that in active matrix type display having a structure in which a pixel matrix portion and a peripheral driving circuit portion (which is composed of an N-channel driver and a P-channel driver in the examples of the present invention) are provided on the same substrate, an N-channel type thin film transistor having a source region and a drain region which are high concentrate impurity regions and impurity regions whose concentration is lower than that of the source and drain regions, the impurity region provided between a channel region and the source region and between the channel region and drain region, respectively, so that their dimension is the same on the source and drain sides each other is provided in the pixel matrix portion; and an N-channel type thin film transistor having a source region and a drain region which are high concentrate impurity regions and impurity regions whose concentration is lower than that of the source/drain region between a channel region and the source region and between the channel region and drain region so that the dimension of that on the drain side is larger than that on the source side; and a P-channel type thin film transistor having no low concentrate impurity region are provided in the peripheral driving circuit portion.

One of the other inventions disclosed in the present specification is characterized in that a fabrication method of an active matrix type display having a structure in which a pixel matrix portion and a peripheral driving circuit portion are provided on the same substrate comprises steps of:

doping impurity which gives N type conductivity to regions which are to be source and drain regions of an N-channel type thin film transistors provided in the pixel matrix portion and in the peripheral driving circuit portion through a non-self-alignment process; and doping impurity which gives P type conductivity to regions which are to be source and drain regions of a P-channel type thin film transistor provided in the peripheral driving circuit portion through a self-alignment process.

Another invention is characterized in that a fabrication method of an active matrix type display having a structure in which a pixel matrix portion and peripheral driving circuit portion are provided on the same substrate comprises steps of:

doping impurity which gives N type conductivity to regions which are to be source and drain regions of an N-channel type thin film transistors provided in the pixel matrix portion and in the peripheral driving circuit portion through a non-self-alignment process;

doping impurity which gives N type conductivity to regions adjacent to the regions which are to be source and drain regions of the N-channel type thin film transistors in concentration lower than that of the regions which are to be the source and drain regions through a self-alignment process; and doping impurity which gives P type conductivity to regions which are to be source and drain regions of a P-channel type thin film transistor provided in the peripheral driving circuit portion through a self-alignment process.

Another invention in which the above-mentioned structure is modified further is characterized, in that the region to which the impurity which gives N type conductivity is doped in the self-alignme nt process is composed of first regions formed adjacent to the source region and second regions formed adjacent to the drain region, the dimension of the first region is larger than a positioning accuracy in the non-self-alignment process during which the impurity which gives N type conductivity is doped, and the dimension of the second region is larger than that of the first region in the peripheral driving circuit portion. Thereby, high reliability may be given to the N-channel type driver portion without reducing its driving capability.

It is noted that the dimension described above is defined as what is in the direction along a moving path of carriers.

In the structure in the present invention, the N-channel type driver portion and the P-channel type driver portion are shown as elements which compose the peripheral driving circuit. Beside the circuit for directly driving the pixel matrix portion (which is generally called as a driver circuit), a shift register circuit and various data processing circuits and memory circuits may be included in the concept of the peripheral driving circuit.

The peripheral driving circuit described in the present specification refers mainly to the driver circuit. Accordingly, the inventions disclosed in the present specification need not be provided with all the above-mentioned elements composing the peripheral driving circuit.

The specific nature of the invention, as well as other objects, uses and advantages thereof, will clearly appear from the following description and from the accompanying drawings.

BRIEF DESCRIPTION OF DRAWINGS

FIGS. 1A, 1B and 1C are diagrams showing steps for fabricating thin film transistors by utilizing the present invention (First Embodiment);

FIGS. 2A, 2B and 2C are diagrams showing steps for fabricating the thin film transistors by utilizing the present invention (First Embodiment);

FIGS. 3A and 3B are diagrams showing steps for fabricating the thin film transistors by utilizing the present invention (First Embodiment);

FIGS. 4A and 4B are diagrams showing steps for fabricating the thin film transistors by utilizing the present invention (First Embodiment);

FIGS. 5A and 5B are diagrams showing steps for fabricating the thin film transistors by utilizing the present invention (First Embodiment);

FIGS. 7A, 7B and 7C are diagrams showing steps for fabricating the thin film transistors by utilizing the present invention (Second Embodiment);

FIGS. 8A and 8B are diagrams showing steps for fabricating the thin film transistors by utilizing the present invention (Second Embodiment);

FIGS. 9A and 9B are diagrams showing steps for fabricating thin film transistors by utilizing the present invention (Second Embodiment);

FIGS. 10A and 10B are diagrams showing steps for fabricating thin film transistors by utilizing the present invention (Third Embodiment);

FIGS. 11A and 11B are diagrams showing steps for fabricating the thin film transistors by utilizing the present invention (Third Embodiment);

FIGS. 12A, 12B and 12C are diagrams showing steps for fabricating thin film transistors by utilizing the present invention (Fourth Embodiment); and FIGS. 13A and 13B are diagrams showing steps for fabricating the thin film transistors by utilizing the present invention (Fourth Embodiment).

DESCRIPTION OF PREFERRED EMBODIMENTS

Figure 6:
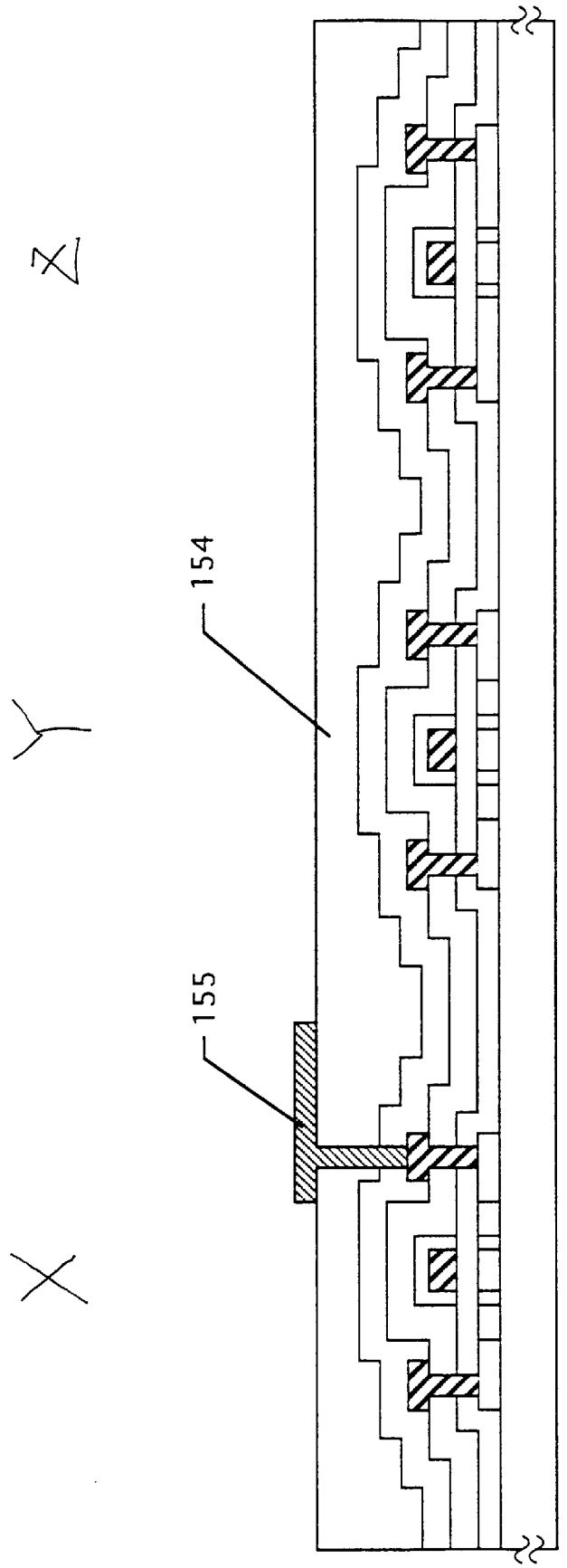
FIG. 6 is a diagram showing a step for fabricating the thin film transistors by utilizing the present invention (First Embodiment)

As shown in FIG. 4, the structure of a thin film transistor is differentiated in each of a pixel matrix portion X, an N-channel type driver portion Y and a P-channel type driver portion Z.

That is, an N-channel type thin film transistor having source and drain regions 108 and 110 formed through a non-self-alignment process shown in FIG. 1B and low concentrate impurity regions 127 and 130 formed through a self-alignment process shown in FIG. 3B is provided in the pixel matrix portion X.

The low concentrate impurity regions in the pixel matrix portion X have a relatively large dimension of 1 $\mu$m to 5 $\mu$m in order to reduce an OFF current. Further, the dimensions of the low concentrate impurity regions on the source and drain sides are equalized each other as much as possible in order to maintain an operational symmetry when a signal voltage applied to the drain is reversed.

It is noted that the dimension is defined as what is in the direction along which carriers move in the present specification.

Thus, the thin film transistor provided in the pixel matrix portion X is rendered to have a low OFF current characteristic by constructing as described above.

Further, an N-channel type thin film transistor in which low concentrate impurity regions 231 and 233 are formed by utilizing a self-alignment process using a gate electrode 222 shown in FIG. 8B is provided in the N-channel type driver portion Y.

The dimension of the first region 231 formed adjacent to the source region in particular is made to be larger than a mask alignment accuracy in a non-self-alignment process during which impurity that gives N type is doped. The dimension of the first region 231 is made to be smaller than that of the second region 233 formed adjacent to the drain region.

The thin film transistors provided in the N-channel type driver portion Y may be formed so as to have high reliability without reducing the driving capability by constructing as described above.

In the P-channel type driver portion Z, it is constructed so as to provide only offset gate regions 143 and 144 using an anodic oxide film 33 as shown in FIGS. 4B and 9B to be able to obtain a high driving capability.

It becomes possible to correct the difference of the driving capability of the thin film transistor provided in the P-channel type driver portion Z from that of the thin film transistor provided in the N-channel type driver portion Y by constructing as described above. That is, the structure in which the difference of the mobility is corrected may be obtained.

[First Embodiment]

FIGS. 1 through 6 show steps for fabricating thin film transistors according to the first embodiment. Steps for fabricating the N-channel type thin film transistor provided in the pixel matrix portion X and the P- and N-channel type thin film transistors composing the driving circuit (buffer circuit) for driving the pixel matrix portion X on the same glass substrate will be described in the present embodiment.

In the figures, the N-channel type driver portion Y refers to the N-channel type thin film transistor portion composing the peripheral driving circuit. The P-channel type driver portion Z refers to the P-channel type thin film transistor portion composing the peripheral driving circuit.

A top gate type thin film transistor in which a gate electrode exists above an active layer is shown as a type of the thin film transistor in the present embodiment. However, the present invention can be also applied to a bottom gate type thin film transistor (an inverted stagger TFT).

Although a glass substrate 101 is used as shown in FIG. 1A in the present embodiment, a quartz substrate or an alumina glass substrate may be used instead of that.

An underlying film not shown is formed on the glass substrate 101 at first. Here, a silicon oxide film having a thickness of 2500 Å is formed as the underlying film by sputtering.

Next, an amorphous silicon film not shown is formed in thickness of 500 Å by plasma CVD. Reduced pressure thermal CVD may be used instead of the plasma CVD. In the present embodiment, an intrinsic or substantially intrinsic (in the sense of not adding a conductive type artificially) amorphous silicon film is formed.

After forming the amorphous silicon film not shown, it is patterned to form patterns 102, 103 and 104 shown in FIG. 1A. These patterns become active layers of the respective thin film transistors. In this state, each of these active layers are composed of the amorphous silicon film.

Here, the pattern 101 is the active layer of the thin film transistor provided in the pixel matrix portion X, the pattern 102 is the active layer of the thin film transistor provided in the N-channel type driver portion Y and the pattern 104 is the active layer of the thin film transistor provided in the P-channel type driver portion Z. Thus, the state shown in FIG. 1A is obtained.

Although each only one the thin film transistor of each portion (X,Y,Z) is shown in the figure because of the restriction in drawing the figure, a number of thin film transistors required are actually formed in the same time in the portion. There is also a case when a type of thin film transistors different from those shown in the figure are formed in the same time.

After obtaining the state shown in FIG. 1A, resist masks 105, 106 and 107 are provided, respectively, as shown in FIG. 1B. Then, P (phosphorus) is doped. This doping step is carried out under the condition of forming source and drain regions of the N-channel type thin film transistor.

Plasma doping and ion implantation may be used as the doping method implemented in the step as shown in FIG. 1B.

The plasma doping is a method comprising steps of transforming gas containing dopant elements such as $PH_3$ and $B_2H_6$ into plasma by high frequency discharge and the like, drawing ionized impurity ions out of the plasma by an electric field and accelerating the impurity ions by an electric field to dope into a region to be doped.

This plasma doping method has a merit that it allows a large area to be dealt with readily.

Meanwhile, the ion implantation is a method of obtaining ions of impurity such as P and B selectively by mass separation utilizing a magnetic field and accelerating them electrically to dope into a region to be doped. In this case, the ions of impurity such as P and B are obtained frequently by transforming the gas containing dopant elements such as $PH_3$ and $B_2H_6$ into plasma by high frequency discharge and the like similarly to the plasma doping.

Because the ion implantation includes the mass separation, it has a merit that only intended element can be doped. However, it has a drawback in dealing with a large area.

The plasma doping which allows a large area to be dealt with readily is used as the doping method of the present embodiment.

This step is called as heavy doping. It indicates expediently that doping is carried out with a high dosage as compared to the doping of P element which is carried out again later. The region into which P (phosphorus) is doped in this step will be denoted as N+ expediently.

As shown in FIG. 1B, no P is doped to the active layer pattern 104 in this step because there exists a resist mask 107. No P is doped also to the regions 109 and 112 because they are masked by the resist masks. Accordingly, the active layer 104, the regions 109 and 112 remain to be I-type (intrinsic) regions.

P is doped directly to each of the regions 108, 110, 111 and 113, thus turning into N+ type (in a strict sense, they turn out to be N+ type after the following activating step).

This doping step is carried in the non-self-alignment process. In the non-self-alignment process, a mask (resist mask) is provided by a photolithographic step and impurity is doped selectively to desired regions by using the mask as a cover.

Thus, the step shown in FIG. 1B is carried out. Next, the resist masks 105, 106 and 107 are removed. In this state, each of the active layer patterns 102, 103 and 104 are in the amorphous state.

Next, laser light is irradiated as shown in FIG. 1C. The irradiation of the laser light exerts the effects of:

crystallizing each of the active layer patterns;

activating the doped P (phosphorus); and annealing the damage caused by the doping of P.

The N+ regions 108 and 110 are crystallized and activated and the I-type region 109 is crystallized in the same time in the pixel matrix portion X by irradiating the laser light.

The N+ regions 111 and 113 are also crystallized and activated and the I-type region 112 is crystallized in the same time in the N-channel type driver portion Y.

The whole active layer pattern 104 is crystallized in the P-channel type driver portion Z. Because no impurity has been doped to the active layer pattern 104 in the P-channel type driver portion Z, only the crystallization advances.

What is important in the step shown in FIG. 1C is that the laser light is irradiated to the portions and to the nearby portions (boundary) where the N+ type regions junction with the I-type region in the pixel matrix portion X and the N-channel type driver portion Y. It exerts a large effect of reducing a density of defects near the junction.

Further, in the same time with the crystallization the P element implanted may be fully activated and it brings about a full characteristic for causing them to function as source and drain regions by irradiating the laser light as described above.

Then, after forming a silicon oxide film 114, an aluminum film 115 for forming gate electrodes is formed in thickness of 4000 Å by sputtering as shown in FIG. 2A.

After forming the aluminum film 115, an anodic oxide film 116 is formed in thickness of 100 Å by anodization. This anodic oxide film 116 functions as a film for enhancing an adherence of a resist mask to be formed later.

Thus, the state shown in FIG. 2A is obtained. Next, resist masks 117, 118 and 119 are provided as shown in FIG. 2B. These resist masks are used in patterning the aluminum film 115 to form the gate electrodes.

Next, the patterning is carried out by using the resist masks 117, 118 and 119. Thus, the state shown in FIG. 2C is obtained.

Then, the state shown in FIG. 3A is obtained by removing the resist masks 117, 118 and 119.

In the state shown in FIG. 3A, the reference numeral 120 denotes the gate electrode of the thin film transistor in the pixel matrix portion X and the anodic oxide film 121 remaining at the top of the gate electrode.

Although not shown, a gate line which is provided in a grid together with a source line is extended from the gate electrode 120.

The reference numeral 122 denotes the gate electrode of the thin film transistor in the N-channel type driver portion Y, the anodic oxide film 123 remaining at the top of the gate electrode, the gate electrode 124 of the thin film transistor in the P-channel type driver portion Z and the anodic oxide 125 film remaining at the top of the gate electrode.

After obtaining the state shown in FIG. 3A, anodization is carried out again. Anodic oxide films 31, 32 and 33 in FIG. 3B are formed in thickness of 1000 Å through this anodization. These anodic oxide films are made into one body with the anodic oxide films 121, 123 and 125, respectively, in the step shown in FIG. 3A.

Next, a resist mask 126 is provided as shown in FIG. 3B. Then, P (phosphorus) is doped again. Here, P is doped with a dosage lower than that in the step shown in FIG. 1B (i.e. light doping).

P (phosphorus) is lightly doped to regions 127 and 130 as well as 131 and 133 in this step. These regions contain P in low concentration as compared to the regions 108 and 110 as well as 111 and 113. The regions 127, 130, 131 and 133 are denoted as N- type, indicating that P element is doped in lower concentration.

It is noted that the regions 108, 110, 111 and 113 remain to be N+ type because P is lightly doped over the N+ type region.

The pattern of the gate electrodes 120 and 122 are used in the above-mentioned doping step, so that this step is called as a self-alignment process. The merit of the self-alignment process is that doping may be carried out selectively by using the electrode pattern and the like already formed without providing a mask specialized only for that process.

Here, P is doped selectively by using the gate electrodes and the anodic oxide films formed on the surface thereof (these are called as a gate electrode portion in total) as masks.

Thus, the regions 127 and 130 having the N- type (low concentrate impurity regions) are formed in the pixel matrix portion X in the manner of self-alignment. Further, the regions 131 and 133 having the N- type (low concentrate impurity regions) are formed in the N-channel type driver portion Y in the manner of self-alignment.

It is noted that the low concentrate impurity regions 130 and 133 adjacent to the drain region are the regions generally called as a LDD (lightly doped drain region).

Thus, the region 108 turns out to be a source region and the region 110 turns out to be a drain region in the pixel matrix portion X. Further, the region 111 turns out to be a source region and the region 113 turns out to be a drain region in the N-channel type driver portion Y.

Because no P is doped to the regions 129 and 132, they remain to be I-type regions. Thus, the state shown in FIG. 3B is obtained. Next, the resist mask 126 is removed.

Then, resist masks 41 and 42 are provided again as shown in FIG. 4A. B (boron) is doped in this state. The doping is carried out by using the plasma doping also in this step.

B is selectively doped to regions 134 and 136 in this step. This doping is carried out by using the gate electrode 124 and the anodic oxide film 33 formed around that (called as a gate electrode portion in total) as a mask in the manner of self-alignment.

B is doped under the condition of turning the regions 134 and 136 into source and drain regions of the P-channel type thin film transistor (heavy doping).

In this step, B is doped to the regions 134 and 136 in the manner of self-alignment to form P+ type regions. The region 135 remains to be I type because the gate electrode portion becomes a mask and no B is doped.

Thus, the state shown in FIG. 4A is obtained. Next, the resist masks 41 and 42 are removed, thus obtaining the state shown in FIG. 4B.

After obtaining the state shown in FIG. 4B, laser light is irradiated to activate the implanted impurity and to anneal the damage of the crystal structure caused by the impact of the ions during the doping.

The anodic oxide film is formed around the gate electrode in the structure shown in the present embodiment. Accordingly, when doping is carried out by using the gate electrode portion as a mask, offset regions (also called as an offset gate region) are formed in correspondence to the thickness of the anodic oxide film in the regions of the active layer corresponding to the portion under the anodic oxide films adjacent to the gate electrode.

The offset regions have an intrinsic or substantially intrinsic conductive type and do not function as a channel region nor as a source/drain region. The offset regions function as high resistance regions which are provided between the channel region and the source region and the channel region and the drain region.

Similarly to the low concentrate impurity region, the offset region also has a function of relaxing a high electric field formed between the source and the channel or between the channel and the drain. Similarly to the case of providing the low concentrate impurity regions, such effects that an OFF current value can be reduced and a hot carrier effect can be reduced can be obtained by providing the offset regions.

FIG. 4B shows the offset regions formed in correspondence to the thickness of the anodic oxide films 31, 32 and 33. That is, regions 137 and 139 are the offset regions formed in correspondence to the thickness of the anodic oxide film 31, regions 140 and 142 are the offset regions formed in correspondence to the thickness of the anodic oxide film 32 and regions 143 and 145 are the offset regions formed in correspondence to the thickness of the anodic oxide film 33.

Because the thickness of the anodic oxide films 31, 32 and 33 is 1000 Å, the dimension of the offset regions described above is also about 1000 Å. Regions 138, 141 and 144 turn out to be channel regions.

After obtaining the state shown in FIG. 4B, a first interlayer insulating film 146 is formed as shown in FIG. 5A. Here, a silicon nitride film is formed in thickness of 3000 Å as the first interlayer insulating film 146 by mean of plasma CVD.

Then, contact holes are created and a metal film not shown is formed to create contact electrodes. Here, a three-layered film composed of a titanium film, an aluminum film and a titanium film is formed as the metal film by sputtering. Then, this metal film (laminated film) is patterned to form electrodes 147, 148, 149, 150, 151 and 152.

Here, the electrodes 147, 149, and 151 are source electrodes and the electrodes 148, 150, 152 are drain electrodes, respectively.

Thus, the state shown in FIG. 5A is obtained. Next, a silicon nitride film is formed in a thickness of 2000 Å again as a second interlayer insulating film 153 by plasma CVD as shown in FIG. 5B.

Then, a third interlayer insulating film 154 is formed by polyimide. Here, the third interlayer insulating film 154 is formed by spin coating. Its surface may be flattened as shown in the figure when a resin film is used.

Thus the state shown in FIG. 5B is obtained. Next, a contact hole is created to form a pixel electrode 155 as shown in FIG. 6. Here, an ITO film is formed in thickness of 1000 Å at first by sputtering. It is then patterned to form the pixel electrode 155.

Finally, a heat treatment is carried out in a hydrogen atmosphere at 350° C. for one hour to reduce defects within the semiconductor layer.

Thus, one substrate composing a liquid crystal panel is completed. This substrate is called as a TFT substrate. After that, a rubbing film (not shown) for orienting liquid crystal and a sealant are formed to paste with an opposite substrate fabricated separately. Then, the liquid crystal panel is completed by filling the liquid crystal between the TFT substrate and the opposite substrate.

In the structure shown in the present embodiment, the thin film transistors having different structures are provided in each of the pixel matrix portion X, the N-channel type driver portion Y and the P-channel type driver portion Z.

The thin film transistor in which the low concentrate impurity regions are provided and which has the low OFF current characteristic is provided in the pixel matrix portion X. The thin film transistor having high reliability by providing the low concentrate impurity regions is provided in the N-channel type driver portion Y. The structure in which the low concentrate impurity regions are provided is useful in that it provides the high reliability and that it will do without reducing the driving capability relatively.

The low concentrate impurity region provided adjacent to the drain has a function of mitigating the electric field between the channel region and the drain region. The move of carriers between the drain and channel may be suppressed during the OFF operation and the OFF current may be reduced by this function. Beside that, the deterioration caused by the hot carrier effect may be suppressed by the above-mentioned function.

Meanwhile, only the offset regions caused by the anodic oxide film are provided in the P-channel type driver portion Z, having the structure not reducing the driving capability.

In general, the P-channel type thin film transistor has a driving capability lower than that of the N-channel type thin film transistor. Accordingly, it is preferable to construct as described above in order to balance with the characteristic of the N-channel type driver portion Y.

It is noted that the OFF current value is not a problem so much in the peripheral driving circuit. Also, the deterioration caused by the hot carrier effect is not a problem in the P-channel type thin film transistor. Accordingly, it is not necessary to provide the low concentrate impurity region like the N-channel type thin film transistor in the P-channel type thin film transistor.

As described above, the adoption of the structure shown in the present embodiment allows the following components to be integrated on the same glass substrate:

the pixel matrix portion X having the low OFF current characteristic;

the N-channel type driver portion Y which is suitable for high speed operation and which has high reliability; and the P-channel type driver portion Z which is suitable for high speed operation and for which the characteristic balance thereof with the N-channel type driver portion Y is taken into consideration.

[Second Embodiment]

The present embodiment is what is the structure shown in the first embodiment is modified. The low concentrate impurity regions 131 and 133 having the same dimension have been provided in the N-channel type driver portion Y In the structure shown in the first embodiment (see FIG. 3B).

These low concentrate impurity regions have been provided in order to improve the reliability without dropping the high frequency characteristics and the driving capability as much as possible. However, the one which mainly exhibits its function (deterioration preventing function) is the low concentrate impurity region 133 adjacent to the drain region 113. Accordingly, the low concentrate impurity region 131 is not necessary in an extreme sense.

The low concentrate impurity region 131 may be considered to be existing just hampering the high frequency characteristics and the driving capability if no function of preventing the deterioration can be expected.

The present embodiment is characterized in that the length (length in the direction connecting source, channel and drain) of the low concentrate impurity region on the drain side is extended to be longer than that on the source side in the N-channel type driver portion Y.

Then, the low concentrate impurity region on the source side is formed to have about a length of absorbing an error of mask alignment accuracy in forming the gate electrode. Thereby, the influence to the high frequency characteristics and the driving capability by its existence may be minimized and the influence (influence given to the characteristics of the thin film transistor) caused by the mask alignment error in the non-self-alignment process may be reduced in the same time.

FIGS. 7 through 9 show steps for fabricating the thin film transistor according to the present embodiment. The same reference numerals denote the same components with those shown in FIGS. 1 through 6. The detail of the fabrication steps of each component is also the same with that shown in the first embodiment unless specifically specified.

At first, active layer patterns 102, 103 and 104 made of amorphous silicon film are formed on a glass substrate 101 as shown in FIG. 7A. Next, resist masks 105, 106 and 107 are provided as shown in FIG. 7B. Then, P (phosphorus) is doped by using these masks (i.e. heavy doping).

Thus, N+ regions 108, 110, 111 and 113 are formed. These regions turn out to be a source region or a drain region.

Next, the resist masks are removed, thus obtaining the state shown in FIG. 7C. Each of the active layer patterns 102, 103 and 104 are crystallized by implementing laser annealing in this state. Further, the P doped in the step in FIG. 7B is activated. In the same time, the damage caused during the doping step in FIG. 7B is annealed.

Next, gate electrodes 120, 222 and 124 and anodic oxide films 121, 223 and 125 are formed as shown in FIG. 8A. The method for forming each gate electrode is basically the same with that shown in FIG. 2.

What is different here from the case of the first embodiment is the position where the gate electrode 222 is provided. In the present embodiment, the gate electrode 222 is provided at the position relatively leaning toward the source region 111. Thereby, the dimension of the low concentrate impurity region 233 on the drain side may be made to be longer than that of the low concentrate impurity region 231 on the source side in the later step.

Next, P is doped with a dosage lower than that in the case of the step shown in FIG. 7B in the state shown in FIG. 8B (light doping). As a result, low concentrate impurity regions 127, 130, 231 and 233 are formed in the same time. reference numeral 34 are an anodic oxide film of the gate electrode 222 and reference numeral 232 is intrinsic region.

In the present embodiment, the length (length on a line connecting the source and drain) of the low concentrate impurity region 233 is made to be longer than that of the low concentrate impurity region 231.

Further, the length of the region 231 is set to be larger than the mask alignment accuracy in forming the gate electrode 222. Thereby, an influence of error of mask alignment may be suppressed.

Next, resist masks 41 and 43 are provided as shown in FIG. 9A to dope B (boron) (heavy doping). The impurity is doped to the P-channel type driver portion Z in this step. A source region 134 and a drain region 136 of the thin film transistor in the P-channel type driver portion Z are formed in the manner of self-alignment. A region 135 remains to be an I-type region.

Then, the resist masks 41 and 43 are removed, thus obtaining the state shown in FIG. 9B. the reference numeral 241 is a channel region, and 240 and 242 are offset regions. Thereafter, the structure in which the pixel matrix portion X, the N-channel type driver portion Y and the P-channel type driver portion Z are integrated on the same glass substrate is completed by following the steps similar to those shown in the first embodiment.

The structure shown in the present embodiment allows the low concentrate impurity region (LDD) having the enough dimension to be provided on the drain region side where it is originally required in the thin film transistor provided in the N-channel type driver portion. Accordingly, the N-channel type driver portion Y may have high reliability. Further, it becomes possible to prevent the driving capability of the N-channel type driver portion Y from dropping by reducing the dimension of the low concentrate impurity region on the source region side which does not specifically contribute in terms of the high reliability.

[Third Embodiment]

The present embodiment relates to a structure in which one of the masks is reduced in the structure shown in the first embodiment.

FIGS. 10 and 11 show fabrication steps of the present embodiment. What is characterized in the present embodiment is that P is doped on the whole surface without using any resist mask in the step shown in FIG. 10B. This step corresponds to that shown in FIG. 3B.

In this step, P (phosphorus) which is the impurity which gives N− type is lightly doped to regions 11 and 13 which are to be source and region regions of the P-channel type thin film transistor. A region 12 is the region to which nothing is doped.

Then, B is doped only to the P-channel type driver portion Z in the step shown in FIG. 11A (heavy doping). In this step, the effect of P (phosphorus) lightly doped in the previous step is canceled by B heavily doped and the conductive type is inverted to P-type due to the effect of B excessively doped. Regions 234 and 236 are the P+ type regions obtained as a result. The reference numeral 235 are an intrinsic region.

The whole structure is completed by following the steps similar to those shown in the first embodiment. The region 244 is a channel region and the regions 243 and 245 are offset regions.(FIG. 11B)

The adoption of the structure shown in the present embodiment allows the structure which is substantially the same with that shown in the first embodiment to be obtained through the fabrication steps in which one of the masks is reduced.

[Fourth Embodiment]

The present embodiment relates to a structure in which the mobility of the P-channel type thin film transistor provided in the P-channel type driver portion Z is maximized. In concrete, it relates to a structure in which no offset region is provided in the P-channel type thin film transistor and the resistance between the source and the drain is minimized in the structure described in the first embodiment.

FIGS. 12 and 13 show fabrication steps of the present embodiment. The parts not specifically described and the components having the same reference numerals are the same with those in the first embodiment.

The state shown in FIG. 12A is obtained at first by following steps similar to those in the first embodiment. This state is totally the same with the state shown in FIG. 2A.

After obtaining the state shown in FIG. 12A, resist masks 117, 118 and 119 are formed to form gate electrodes.

Thus, the state shown in FIG. 12B is obtained. Next, a resist mask 1201 is provided as shown in FIG. 12C. Thereby, the pixel matrix portion X and the N-channel type driver portion Y are masked and only the P-channel type driver portion Z is exposed.

B (boron) is doped in the state shown in FIG. 12C (heavy doping). In this step, a source region 334 and a drain region 336 are formed in the manner of self-alignment. A channel region 335 is also defined in the manner of self-alignment.

No offset region is formed in this step because no anodic oxide film is formed on the side surfaces of the gate electrode 324.

Next, the resist mask 1201 is removed and a resist mask 1202 is provided over only the P-channel type driver portion Z. Then, anodic oxide films 31 and 32 are formed by implementing another anodization as shown in FIG. 13A.

Then, P is doped as shown in FIG. 13B (light doping). In this step, low concentrate impurity regions 127, 130, 131 and 133 are formed. Steps thereafter are the same with those in the first embodiment.

The structure of the present embodiment is characterized in that the thin film transistor formed in the P-channel type driver portion Z has no offset region.

Thereby, the driving capability of the P-channel type driver portion Z may be maximized and the balance with the N-channel type driver portion Y may be improved.

The utilization of the invention disclosed in the present specification allows the thin film transistors having different characteristics to be integrated on the same substrate. It then allows to provide the peripheral driving circuit integrated active matrix type liquid crystal display which is balanced as a whole.

In concrete, the thin film transistor having the low OFF current characteristic may be formed in the pixel matrix portion X, the thin film transistor having high reliability and a high driving capability may be formed in the N-channel type driver portion Y, and the thin film transistor having a high driving capability which corresponds to the N-channel type driver portion Y may be formed in the P-channel type driver portion Z.

The invention disclosed in the present specification may be also utilized in other flat panel displays having the active matrix. For instance, it may be utilized in an active matrix display using EL elements.

While the preferred embodiments have been described, variations thereto will occur to those skilled in the art within the scope of the present inventive concepts which are delineated by the following claims.

What is claimed is:

1. A method for fabricating an active matrix type display having a structure in which a pixel matrix portion and a peripheral driving circuit portion are provided on the same substrate, comprising steps of:

doping an N type impurity to regions to be source and drain regions of N-channel type thin film transistors provided in said pixel matrix portion and in said peripheral driving circuit portion through a non-self-alignment process; and doping a P type impurity to regions to be source and drain regions of a P-channel type thin film transistor provided in said peripheral driving circuit portion through a self-alignment process.

2. A method according to claim 1, wherein a laser light is irradiated to said regions to be said source and drain regions after the step of doping the N type impurity through the non-self-alignment process.

3. A method according to claim 1, wherein the doping is carried out selectively by using resist masks in the non-self-alignment process.

4. A method according to claim 1, wherein the doping is carried out selectively by using gate electrode portions as masks in the self-alignment process.

5. A method for fabricating an active matrix type display having a structure in which a pixel matrix portion and peripheral driving circuit portion are provided on the same substrate, comprising steps of:

doping an N type impurity to regions to be source and drain regions of N-channel type thin film transistors provided in said pixel matrix portion and in said peripheral driving circuit portion through a non-self-alignment process;

doping the N type impurity to regions adjacent to said regions to be source and drain regions of said N-channel type thin film transistor in concentration lower than that of said regions to be said source and drain regions through a self-alignment process; and doping a P type impurity to regions which to be source and drain regions of a P-channel type thin film transistor provided in said peripheral driving circuit portion through a self-alignment process.

6. A method according to claim 5, wherein a laser light is irradiated to said regions which are to be said source and drain regions after the step of doping the N type impurity through the non-self-alignment process.

7. A method according to claim 5, wherein the doping is carried out selectively by using resist masks in the non-self-alignment process.

8. A method according to claim 5, wherein the doping is carried out selectively by using gate electrode portions as masks in the self-alignment process.

9. A method according to claim 5, wherein said regions to which the N type impurity is doped in the self-alignment process comprise a first region formed adjacent to the source region and a second region formed adjacent to the drain region, wherein, in said pixel matrix portion, the dimensions of said first and second regions are almost the same each other, and wherein, in said peripheral driving circuit portion, the dimension of said second region is larger than that of said first region.

10. The method according to claim 9, wherein the dimensions are defined as what is in the direction along a moving path of carriers.

11. A method according to claim 5, wherein said regions to which the N type impurity is doped in the self-alignment process comprise a first region formed adjacent to the source region and a second region formed adjacent to the drain region, wherein, in said pixel matrix portion, dimensions of said first and second regions are almost the same each other, and wherein, in said peripheral driving circuit portion, the dimension of said first region is larger than a mask alignment accuracy in the non-self-alignment process and the dimension of said second region is larger than that of said first region.

12. The method according to claim 11, wherein the dimensions are defined as what is in the direction along a moving path of carriers.

13. A method for fabricating a semiconductor device comprising the steps of:

forming a plurality of semiconductor islands on an insulating surface;

forming resist masks on said semiconductor islands, respectively, each of said resist masks covering at least a portion to be a channel region in each of said semiconductor islands;

introducing phosphorus into said semiconductor islands utilizing said resist masks to form $N^+$ regions in said semiconductor islands, respectively;

laser annealing to said semiconductor islands; and introducing phosphorus into said semiconductor islands to form channel regions and $N^-$ regions in said semiconductor islands, respectively, wherein each of said low doped regions is interposed between said source and drain regions and said channel region in each of said semiconductor island.

14. A method for fabricating a semiconductor device comprising the steps of:

forming a plurality of semiconductor islands on an insulating surface;

forming resist masks on said semiconductor islands, respectively, each of said resist masks covering at least a portion to be a channel region in each of said semiconductor islands;

forming source and drain regions in each of said semiconductor islands by introducing first impurities into said semiconductor islands utilizing said resist masks;

removing said resist masks;

laser annealing to said semiconductor islands; and forming a channel region and low doped regions in each of said semiconductor islands by introducing said first impurities into said semiconductor islands, wherein each low doped region is interposed between said source and drain regions and said channel region in each of said semiconductor island.

* * * * *